(12) United States Patent
Fujii et al.

(10) Patent No.: US 7,958,608 B2
(45) Date of Patent: Jun. 14, 2011

(54) PROCESS FOR MANUFACTING A PIEZOELECTRIC DEVICE

(75) Inventors: Takamichi Fujii, Kanagawa (JP);
Yasukazu Nihei, Kanagawa (JP);
Yoshikazu Hishinuma, Kanagawa (JP);
Tsuyoshi Mita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 174 days.

(21) Appl. No.: 12/206,518

(22) Filed: Sep. 8, 2008

(65) Prior Publication Data

US 2009/0066763 A1 Mar. 12, 2009

(30) Foreign Application Priority Data

Sep. 12, 2007 (JP) ................. 2007-236308

(51) Int. Cl.
*H04R 17/10* (2006.01)
*H01L 21/302* (2006.01)
(52) U.S. Cl. ............... 29/25.35; 29/DIG. 16; 29/847; 438/706; 438/745; 310/324; 310/364
(58) Field of Classification Search ............ 29/25.35, 29/594, 847, DIG. 16; 438/706, 712, 745, 438/757; 310/324, 364
See application file for complete search history.

(56) References Cited

U.S. PATENT DOCUMENTS

| | | | | |
|---|---|---|---|---|
| 3,615,947 A * | 10/1971 | Yamada | ............ | 438/757 X |
| 6,469,597 B2 * | 10/2002 | Ruby et al. | ............ | 29/25.35 X |
| 7,057,477 B2 * | 6/2006 | Wang | ............ | 310/324 X |
| 7,109,826 B2 * | 9/2006 | Ginsburg et al. | ............ | 310/324 X |
| 2003/0132683 A1 | 7/2003 | Yamada et al. | | |
| 2005/0168112 A1 | 8/2005 | Aoki et al. | | |

FOREIGN PATENT DOCUMENTS

| | | | | |
|---|---|---|---|---|
| JP | 59023613 A * | 2/1984 | ............ | 310/324 |
| JP | 2004-048639 A | 2/2004 | | |
| JP | 3849773 B2 | 2/2004 | | |
| JP | 2004-186646 A | 7/2004 | | |
| JP | 2007-173691 A | 7/2007 | | |

OTHER PUBLICATIONS

Machine English translation of JP-2007-173691-A published Jul. 5, 2007.
Chen Chao et al., "Measurement of Longitudinal Piezoelectric Coefficient of Lead Zirconate Titanate Thin/Thick Films Using a Novel Scanning Mach-Zehnder Interferometer", Thin Solid Films, vol. 493, Dec. 31, 2005, pp. 313-316.
Chinese Office Action issued Sep. 4, 2009, in corresponding Chinese Application No. 200810213853.8.

* cited by examiner

*Primary Examiner* — A. Dexter Tugbang
(74) *Attorney, Agent, or Firm* — Birch, Stewart, Kolasch & Birch, LLP (57) ABSTRACT

The piezoelectric device includes a substrate, a first electrode formed on the substrate, a piezoelectric film formed on the first electrode and a second electrode formed on a second side of the piezoelectric film which is away from a first side where the first electrode is formed. The first electrode is composed of a first layer in contact with the substrate and a second layer in contact with the piezoelectric film. The first layer is formed of a material that is wet etched at a different rate than the substrate. The ink-jet head includes the piezoelectric device, a liquid droplet storing/ejecting member for ejecting ink droplets through a ink spout and provided on the piezoelectric device and a diaphragm for vibrating in response to expansion or contraction of the piezoelectric device and provided between the piezoelectric device and the liquid droplet storing/ejecting member.

12 Claims, 4 Drawing Sheets

PROCESS FOR MANUFACTING A PIEZOELECTRIC DEVICE

The entire contents of documents cited in this specification are incorporated herein by reference.

BACKGROUND OF THE INVENTION

The present invention relates to a piezoelectric device, an ink-jet head using the same, and a process for producing the same.

The conventional actuator that can typically be used as a drive mechanism for an ink-jet head that ejects ink droplets or as a pressure sensor is a piezoelectric device that uses a piezoelectric film which expands or contracts according as the applied voltage varies. The piezoelectric device has a lower electrode, the piezoelectric film and an upper electrode that are superposed on an Si— or otherwise formed substrate, and by applying voltage to it from the lower and upper electrodes, the piezoelectric film is allowed to expand or contract.

An example of this piezoelectric device is described in JP 3849773 B and it is fabricated by the steps of patterning a lower electrode 60 to form an overall pattern, then forming a piezoelectric film layer and an upper electrode film layer by the sol-gel method, sputtering or the like, and selectively etching the piezoelectric film layer and the upper electrode film layer to provide a desired pattern for the piezoelectric device.

In subsequent steps, an adhering layer and an overlying layer are formed on top of the upper electrode film layer and after forming a mask layer that serves as a mask pattern, the overlying layer is selectively removed by dry etching and thereafter the adhering layer is removed by wet etching to form lead electrodes on the upper electrode film layer.

JP 2004-186646 A describes a piezoelectric device in which an electrically conductive material such as Pt is deposited to a thickness of 0.1 µm to 0.4 µm on a second electrode layer that serves as the lower electrode.

SUMMARY OF THE INVENTION

According to JP 3849773 B, the lower electrode, the piezoelectric film and the upper electrode in the piezoelectric device it proposes are fabricated by patterning through dry etching or wet etching. In addition, the lower electrode is formed of a noble metal such as Ir or Pt in order to enhance such properties as the adhesion to the piezoelectric film and electrical conductivity; to pattern the lower electrode, dry etching is applied.

However, if the lower electrode is patterned by dry etching, "overetching" occurs—not only the lower electrode but also the substrate which supports it is etched.

If the piezoelectric device is to be used in an ink-jet head, partial deficiency in the substrate may cause a problem in that the diaphragm will not vibrate accurately, causing ink droplets to be ejected with lower precision.

If the sheet resistance of the lower electrode is reduced, more piezoelectric devices can be arranged (i.e., higher packing density) while cutting the power consumption. To reduce the sheet resistance, the thickness of the electrode may be increased but then an expensive apparatus will result.

It is therefore an object of the present invention to solve the aforementioned problems of the prior art by providing a piezoelectric device that can be produced easily with high precision and which yet is inexpensive and consumes less power.

Another object of the present invention is to solve the aforementioned problems of the prior art by providing an ink-jet head that is capable of recording high-quality image and which can be produced easily with high precision.

Still another object of the present invention is to solve the aforementioned problems of the prior art by providing a process by which a piezoelectric device that is inexpensive, consumes less power and which is driven with high precision can be produced easily with high precision.

In order to achieve the first object, a first aspect of the present invention provides a piezoelectric device comprising: a substrate; a first electrode formed on the substrate; a piezoelectric film formed on the first electrode; and a second electrode formed on a second side of the piezoelectric film which is away from a first side where the first electrode is formed, wherein the first electrode is composed of a first layer in contact with the substrate and a second layer in contact with the piezoelectric film; and the first layer is formed of a material that is wet etched at a different rate than the substrate.

The first layer is preferably formed of at least one material selected from the group consisting of W, TiW, Au, Cu, Al, Ni, and Cr.

The second layer is preferably formed of at least one material selected from the group consisting of Pt, Ir, Ru, Rh, and Pd.

The first electrode preferably has a sheet resistance of no greater than 0.5 Ω/sq.

The substrate is preferably formed of Si or $SiO_2$.

In order to achieve the second object, a second aspect of the present invention provides an ink-jet head comprising: the piezoelectric device according to claim 1; a liquid droplet storing/ejecting member that is provided on a side of the piezoelectric device closer to the substrate and which comprises an ink compartment formed in a position in a face-to-face relationship with the piezoelectric device and an ink spout formed on the ink compartment to get ink droplets to be ejected through the ink spout; and a diaphragm that is provided between the piezoelectric device and the liquid droplet storing/ejecting member and which, in response to expansion or contraction of the piezoelectric device, vibrates to change a capacity of the ink compartment in the liquid droplet storing/ejecting member.

The piezoelectric device preferably has a plurality of piezoelectric units each being composed of the first electrode, the piezoelectric film and the second electrode, the piezoelectric units being arranged on the substrate at a density of at least 1200 npi (nozzles per inch). The symbol npi stands for the number of nozzles provided per inch.

In order to achieve the third object, a third aspect of the present invention provides a process for producing a piezoelectric device having a first electrode, a piezoelectric film and a second electrode formed in superposition on a substrate, comprising the steps of: forming on the substrate a first metal film that is composed of a material that is wet etched at a different rate than the substrate; forming a second metal film on the first metal film; forming a piezoelectric film layer over the second metal film; patterning the piezoelectric film layer by etching to form the piezoelectric film; patterning the second metal film by dry etching; and patterning the first metal film by wet etching to form the first electrode.

The piezoelectric film preferably expands or contracts according to voltage applied by the first electrode and the second electrode.

According to the first aspect of the present invention, the first electrode has a two-layer structure and this contributes to reducing not only the amount of the noble metal used in the first electrode but also the sheet resistance of the first electrode.

In addition, the first layer in the two-layer structure is fabricated from a material that will be wet etched at a different rate than the substrate and this enables dry etching to be applied to the second layer and wet etching to the first layer; even if the second layer is overetched in dry etching, only the first layer is removed, so the substrate can be prevented from becoming deficient in certain areas; as a further advantage, the first layer can be etched with a solution that will not etch the substrate.

As a result, there can be obtained a piezoelectric device that features high precision and low resistance and which is inexpensive.

As a further advantage, the piezoelectric device according to the first aspect of the present invention can be manufactured by the combination of dry etching and wet etching and it can be manufactured easily with high precision even if dry etching has only low precision.

According to the second aspect of the present invention, the piezoelectric device that uses a uniform and precise substrate allows the vibrations of the piezoelectric film to be transmitted to the diaphragm in high precision. As a result, ink droplets can be ejected in high precision with a sufficiently enhanced response in ejection to enable the formation of precise image.

As a further advantage, the first electrode can be made to have low enough resistance that power consumption can be reduced; in addition, the need to use a smaller amount of a noble metal contributes to reducing the manufacturing cost. What is more, as mentioned above, the piezoelectric device to be used in the ink-jet head according to the second aspect of the present invention can be manufactured by the combination of dry etching and wet etching, which contributes to facilitating its manufacture.

According to the third aspect of the present invention, the first electrode has a two-layer structure and the second layer in the two-layer structure is patterned by dry etching whereas the first layer is patterned by wet etching, whereby dry etching can be performed without etching the substrate. In addition, the first layer in the two-layer structure is fabricated from a material that will be wet etched at a different rate than the substrate and this contributes to preventing the substrate from being etched during wet etching. As a result, inexpensive and precise piezoelectric devices can be manufactured easily with high precision.

BRIEF DESCRIPTION OF THE DRAWINGS

FIGS. 4A to 4I show schematically the steps in the process of the present invention for producing a piezoelectric device.

DETAILED DESCRIPTION OF THE INVENTION

On the following pages, the piezoelectric device, the ink-jet head that uses it and the process for producing the piezoelectric device according to the present invention are described in detail with reference to the embodiments depicted in the accompanying drawings.

Figure 1:
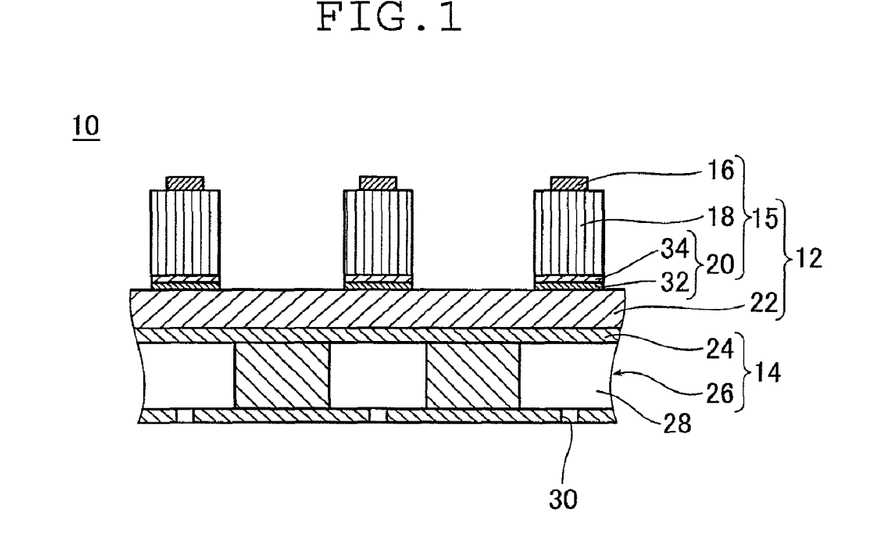
FIG. 1 is a sectional view showing the general layout of an embodiment of the ink-jet head of the present invention that uses the piezoelectric device of the present invention.

FIG. 1 is a sectional view showing the general layout of an ink-jet head according to the second aspect of the present invention that uses a piezoelectric device according to the first aspect of the present invention.

A ink-jet head generally indicated by 10 in FIG. 1 comprises a piezoelectric device 12 and a head substrate 14. As shown in FIG. 1, the ink-jet head 10 has a plurality of piezoelectric units 15 arranged at given spacings on the head substrate 14 such that one piezoelectric unit 15 combines with the corresponding portion of the head substrate 14 to form one ejecting portion. The respective ejecting portions have the same structure, so on the following pages, they are represented by one ejecting portion that is composed of one piezoelectric unit 15 and the corresponding portion of the head substrate 14, and the respective components are described below.

First, the piezoelectric device 12 has the piezoelectric unit 15 which is composed of an upper electrode 16, a piezoelectric film 18, and a lower electrode 20, and a substrate 22; the lower electrode 20, piezoelectric film 18, and upper electrode 16 are superposed on the substrate 22 in the order written.

The substrate 22 is a member in a plate form that is common to the plurality of piezoelectric units 15, which are individually supported by this substrate 22.

The substrate 22 may be a member in a plate form that is made from a variety of materials including silicon, glass, stainless steel, yttrium-stabilized zirconia (YSZ), alumina, sapphire, and silicon carbide. If desired, a laminated substrate such as an SOI substrate having a $SiO_2$ film and a Si active layer superposed in that order on a silicon substrate may be used as the substrate 22.

The substrate is preferably formed of Si or $SiO_2$. The substrate formed of Si or $SiO_2$ is easy to process and available at low cost. As will be described later, this offers a further advantage of providing ease with which the substrate can have a different etching rate (selectivity) in wet etching than a first layer 32 of the first electrode 20.

The piezoelectric unit 15 has the upper electrode 16, piezoelectric film 18, and lower electrode 20.

The upper electrode 16 is in a plate form and provided on one side of the piezoelectric film 18. The upper electrode 16 is connected to a power source not shown. This upper electrode 16 may be formed of various materials including, for example, metals such as Au, Pt and Ir, metal oxides such as $IrO_2$, $RuO_2$, $LaNiO_3$ and $SrRuO_3$, as well as electrode materials like Al, Ta, Cr and Cu that are commonly used in semiconductor processes, and combinations of these materials.

To have better adhesion to the piezoelectric film 18, the upper electrode 16 may have a multi-layer structure comprising an adhering layer and the electrode layer in superposition.

The piezoelectric film 18 is a member that has a certain thickness in a direction from the upper electrode 16 toward the lower electrode 20 (from top to bottom as seen in FIG. 1) and it expands or contracts according as the applied voltage varies. The piezoelectric film 18 is mainly composed of $Pb_xB_yO_z$ and formed on top of the lower electrode 20; in the formula $Pb_xB_yO_z$, subscripts x, y and z are any real number; B is an element at site B which is at least one member of the group consisting of Ti, Zr, V, Nb, Ta, Cr, Mo, W, Mn, Sc, Co, Cu, In, Sn, Ga, Zn, Cd, Fe, Ni, and lanthanides. A typical case of the piezoelectric film is where x=y=1 and z=3, with x and y being adjustable within a range that allows for the piezoelectric film to assume the perovskite structure. If the piezoelectric film is mainly composed of $Pb_xB_yO_z$, its piezoelectric characteristics can be enhanced by rendering it to have the perovskite structure.

In a preferred embodiment, the piezoelectric film 18 is mainly composed of lead zirconate titanate (PZT) that has Zr and Ti as elements at site B. Being mainly composed of PZT, the piezoelectric film 18 is capable of having enhanced piezoelectric characteristics and featuring a comparatively low price.

The material of the piezoelectric film is in no way limited to lead zirconate titanate (PZT) and it is possible to use lead-containing compounds such as lead titanate, lead zirconate, lead lanthanum titanate, lead lanthanum zirconate titanate, and lead magnesium niobate zirconium titanate.

In the embodiment under consideration, the piezoelectric film is mainly composed of $Pb_xB_yO_z$ but it is also possible to use compounds that do not contain lead at site A, as exemplified by zirconium nickel niobate, bismuth potassium titanate, sodium niobate, potassium niobate, and lithium niobate.

The piezoelectric film 18 is preferably fabricated by a vapor phase deposition. Specifically, one may use plasma-assisted vapor phase deposition, light-, heat- or otherwise assisted vapor phase deposition, and various other vapor phase deposition including sputtering, ion-beam sputtering, ion plating, and CVD.

By using vapor phase deposition, one can fabricate a piezoelectric film without anneal treatment or the like; since Pb loss and other troubles can be prevented, the piezoelectric film obtained features high uniformity.

The lower electrode 20 is provided between the substrate 22 and the piezoelectric film 18. In other words, the lower electrode 20 is provided on the side of the piezoelectric film 18 which is away from the side where the upper electrode 16 is provided. This lower electrode 20 is connected to a power source or a grounded terminal, neither of which is shown.

The lower electrode 20 is of such a structure that the first layer 32 on the side closer to the substrate 22 is overlaid with a second layer 34 on the side closer to the piezoelectric film 18.

The first layer 32 is a member in a sheet form that is provided on top of the substrate 22 and it serves as an electrode formed in a predetermined pattern. In the embodiment under consideration, the first layer 32 is formed in generally the same pattern as that for the arrangement of piezoelectric films.

The first layer 32 is fabricated from a material that will be wet etched at a different rate than the substrate 22. To be more specific, the first layer 32 is fabricated from a material that can be wet etched with a solution that has only a small or no etching effect on the substrate 22. The first layer 32 is made of an electrically conductive material, which is preferably at least one member of the group consisting of W, TiW, Au, Cu, Al, Ni, and Cr.

The first layer 32 is preferably fabricated from a material that can be wet etched at a rate (selectivity) at least 10 times as fast as the substrate 22. By securing the at-least-10-times-faster etching rate, the first layer 32 can be etched without the risk of etching the substrate 22, whereby the unwanted areas of the first layer 32 can be removed while preventing undesirable deficiency of the substrate 22.

The second layer 34 is a member in a sheet form that is provided on top of the first layer 32 and it serves as an electrode formed in the same pattern as the first layer 32.

The second layer 34 adheres to the piezoelectric film 18 and is fabricated from a different material than the first layer 32. The second layer 2 is also made of an electrically conductive material which may be selected from among metals such as Au, Pt, Ir, Ru, Rh and Pd, metal oxides such as $IrO_2$, $RuO_2$, $LaNiO_3$ and $SrRuO_3$, and combinations of these materials.

In particular, in order to enhance the strength of adhesion to the piezoelectric film 18 and provide higher electrical conductivity (lower the resistivity), the second layer is preferably fabricated from at least one member of the group consisting of Pt, Ir, Ru, Rh, and Pd.

The lower electrode 20 preferably has a sheet resistance of 0.5 Ω/sq or less. By adjusting the sheet resistance of the lower electrode 20 to no greater than 0.5 Ω/sq, power consumption can be reduced. In addition, the two-layer structure makes it possible to lower the sheet resistance even if less of an expensive noble metal is used and this lowers the manufacturing cost, contributing to a less expensive piezoelectric device.

The lower electrode 20 is preferably designed to be such that the stress on the first layer 32 has a different direction than the stress on the second layer 34. More specifically, the first layer 32 and the second layer 34 are preferably formed in such a way as to attain a balance of stresses.

By thusly ensuring that the stress on the first layer 32 has a different direction than the stress on the second layer 34, the warpage of the substrate can be reduced and exact alignment can be realized during etching and other operations, thereby enabling the fabrication of a highly precise ink-jet head.

Described above is the basic structure of the piezoelectric device 12.

The piezoelectric device 12 has voltage applied to the piezoelectric film 18 from the upper electrode 16 and the lower electrode 20 between which the piezoelectric film 18 is sandwiched. The piezoelectric film 18 expands or contracts as it is supplied with voltage from the upper electrode 16 and the lower electrode 20.

By fabricating the lower electrode 20 of the piezoelectric device 12 to have a two-layer structure, less of a noble metal need be used in the lower electrode 20 and its sheet resistance can also be reduced. In addition, by using one or more of the above-mentioned metals in the second layer of the lower electrode 20, the strength of its adhesion to the piezoelectric film can be enhanced, so that a piezoelectric film can advantageously be fabricated on the lower electrode 20 by a vapor phase deposition such as sputtering. Specifically, piezoelectric films comprising perovskite crystals with a small enough amount of Pb loss can be grown in a consistent manner.

The two-layer structure offers yet another advantage of enabling dry etching to be applied to the second layer and wet etching to the first layer; even if the lower electrode is overetched in dry etching, only the first layer is removed, so the substrate can be prevented from becoming deficient in certain areas. What is more, since the first layer is fabricated from a material that will be wet etched at a different rate than the substrate 22, the substrate 22 can be prevented from becoming deficient in certain areas (the substrate will not be damaged) during patterning of the lower electrode 20.

As a result, there can be obtained a piezoelectric device that features high precision and low resistance and which is inexpensive.

We next describe the head substrate 14.

The head substrate 14 has a diaphragm 24 that transmits the vibrations of the piezoelectric device 12 (or its component, piezoelectric unit 15) and an ink storing/ejecting member 26 that stores ink and ejects ink droplets in response to the vibrations of the diaphragm 24; the head substrate 14 is provided on that side of the substrate 22 which is away from the side where the piezoelectric unit 15 is provided. The head substrate 14 comprises, in order from the substrate 22 of the piezoelectric device 12, the diaphragm 24 and the ink storing/ejecting member 26 in a superposed relationship.

The diaphragm 24 is provided on that side of the substrate 22 which is away from the side where the piezoelectric devices 12 are provided. The diaphragm 24 vibrates as the piezoelectric unit 15 in the piezoelectric device 12 provided in a position away from it expands or contracts.

The ink storing/ejecting member 26 is provided on that side of the diaphragm 24 which is away from the substrate 22 and is formed of an ink compartment 28 for storing ink and an ink spout 30 through which ink droplets are ejected.

The ink compartment 28 is a space that stores a predetermined amount of ink and is provided in a position that faces the piezoelectric unit 15 in the piezoelectric device 12. This ink compartment 28 is provided with one ink spout 30 on the side that is away from the piezoelectric unit 15.

The ink compartment 28 is defined by the diaphragm 24 on the side that faces the piezoelectric device 12 and its capacity varies as the diaphragm 24 vibrates. To be more specific, when voltage is applied to the piezoelectric film 18 from the upper electrode 16 and the lower electrode 18, the diaphragm 24 vibrates in the corresponding position to reduce the capacity of the ink compartment 28. If the capacity of the ink compartment 28 decreases, the ink stored in the ink compartment 28 is ejected as an ink droplet through the ink spout 30.

Note that the ink compartment 28 is connected to an ink supply means not shown so that once an ink droplet has been ejected through the ink spout 30, the ink compartment 28 is refilled with ink. This is how the ink compartment 28 keeps a specified amount of ink stored in it.

Described above is the basic structure of the ink-jet head 10.

We now explain how the ink-jet head 10 operates to eject ink.

It should first be mentioned that the lower electrode 20 in the ink-jet head 10 is driven in one step for the plurality of piezoelectric units and is either supplied with a given voltage or grounded.

Given this condition, a voltage is applied to the upper electrode 16 in response to an image signal, whereupon the voltage on the piezoelectric film 18 varies to deform it.

When the piezoelectric film 18 deforms, the diaphragm 24 on one side of the ink compartment 28 that corresponds to the film 18 vibrates to reduce the capacity of the ink compartment 28.

When the capacity of the ink compartment 28 decreases, the pressure of the ink stored in the ink compartment 28 becomes high enough to eject an ink droplet through the ink spout 30.

Thus, in response to image signals, ink droplets are ejected to form an image or they are deposited on a medium of interest.

As mentioned before, the lower electrode can be fabricated without overetching the substrate of the piezoelectric device, so the ink-jet head 10 features a uniform thickness of the substrate. As a result, the vibrations of the piezoelectric unit in the piezoelectric device can be transmitted to the diaphragm in high precision. These accurate vibrations of the diaphragm allow the capacity of the ink compartment to vary accurately. As a result, ink droplets can be ejected more accurately to assure higher response in ink ejection from the ink-jet head.

What is more, the sheet resistance of the lower electrode in the piezoelectric device can be reduced, so the piezoelectric device will generate less heat and consume less power.

The ink-jet head is preferably such that the piezoelectric units in the piezoelectric device are arranged at a density of at least 1200 npi (nozzles per inch). By adjusting the density at which the piezoelectric units are arranged, or the density at which the ejecting portions are arranged, to 1200 npi or more, image of higher quality can be recorded with a smaller ink-jet head. In addition, as already mentioned, the vibrations of the piezoelectric units can be accurately transmitted to the diaphragm, so ink droplets can be accurately ejected even if the piezoelectric units are arranged at a higher density.

In the embodiment described above, the substrate 22, diaphragm 24, and ink storing/ejecting member 26 are formed as separate members; if desired, this may be replaced by a monolithic structure that consists of a single member in a plate form that is provided with not only ink compartments and ink storing/ejecting members but also a diaphragm. In other words, the substrate 22 may be so configured that a diaphragm and ink storing/ejecting members are formed in it.

In the foregoing embodiment, the ink-jet head of the present invention has been described as one that ejects ink droplets but this is not the sole case of the present invention and it may be used as a variety of liquid droplet ejecting heads. For example, it may be used as a liquid droplet ejecting head by means of which an initiator of a chemical reaction is ejected as droplets onto a medium of interest or as a liquid droplet ejecting head by means of which a liquid is ejected as droplets into a solvent to mix in a specified amount.

We next describe an embodiment of the process for producing the piezoelectric device of the present invention.

First, an exemplary apparatus that may be used to produce the piezoelectric device of the present invention is described.

Figure 2:
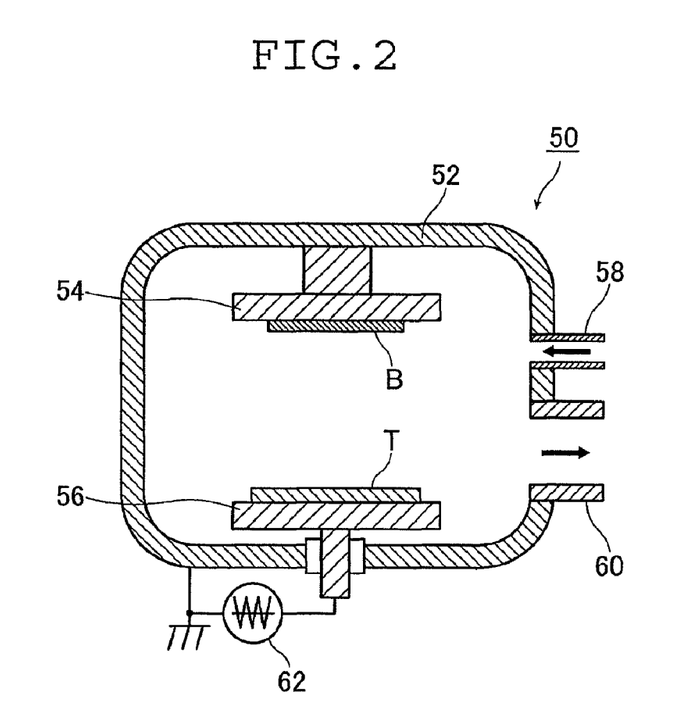
FIG. 2 is a sectional view showing the general layout of an example of a sputtering apparatus that may be used to fabricate a piezoelectric device.

FIG. 2 is a sectional view showing the general layout of an example of a sputtering apparatus 50 that may be used in the process for producing the piezoelectric device of the present invention.

The sputtering apparatus 50 is an apparatus that deposits the piezoelectric film 18 on the lower electrode 20 by a plasma-assisted sputtering method which is a vapor phase deposition; it comprises a vacuum vessel 52, a support section 54, a plasma electrode 56, a gas supply pipe 58, a gas exhaust pipe 60, and a RF power source 62.

The vacuum vessel 52 is a highly hermetic vessel that is formed of iron, stainless steel, aluminum or the like. The vacuum vessel 52 may be of various types that are employed in sputtering apparatuses, including a vacuum chamber, a bell jar, and a vacuum tank.

The support section 54 is provided within the vacuum vessel 52 on the side closer to the top. It is composed of a support mechanism for supporting a deposition base B having the lower electrode 20 formed on its lower side and a heating mechanism for heating the supported deposition base B at a predetermined temperature.

The deposition base B mentioned above is not limited in any particular way as long as it has the lower electrode 20 formed on its lower side; for example, it may be the substrate 22 having the lower electrode 20 formed on it, or it may be a base having the substrate 22 joined to the head substrate 14 provided with the diaphragm 24 and the ink storing/ejecting members 26.

The plasma electrode 56 is provided within the vacuum vessel 52 on the side closer to the bottom. Namely, the plasma electrode 56 is in a face-to-face relationship with the support section 54. The plasma electrode 56 has a target T mounting section on the side which faces the support section 54 and it is also connected to the RF power source 62 for applying voltage. The target T here referred to is a material that is suitably chosen in accordance with the composition of the film which is to be deposited on the lower electrode 20 in the deposition base B.

The gas supply pipe 58 is for supplying a gas or gases into the vacuum vessel 52 and is connected to a gas tank and the like that are not shown. The gas exhaust pipe 60 is for discharging gases from within the vacuum vessel 52 and is connected to a vacuum pump and the like that are not shown. Examples of the gas that may be introduced into the vacuum vessel 52 through the gas supply pipe 58 include argon (Ar) and a mixture of argon (Ar) and oxygen ($O_2$) gases.

We next describe the method of depositing a film with the sputtering apparatus 50.

First, the deposition base B is mounted on the support section 54 and the target T on the mounting section of the plasma electrode 56. Then, the gas or gases in the vacuum vessel 52 are discharged through the gas exhaust pipe 60 while at the same time a gas is introduced into the vacuum vessel 52 through the gas supply pipe 58 until it is filled with the gas.

Subsequently, voltage is applied to the plasma electrode 56 from the RF power source 62 to cause discharge. When discharge occurs at the plasma electrode 56, the gas within the vacuum vessel 52 forms a plasma to generate positive ions of the gas. The generated positive ions sputter the target T. The constituent elements of the sputtered target T are released from the target and vapor-deposited, in either a neutral or ionized state, on the deposition base B.

This is how the sputtering apparatus 50 forms a film on the deposition base B.

Figure 3:
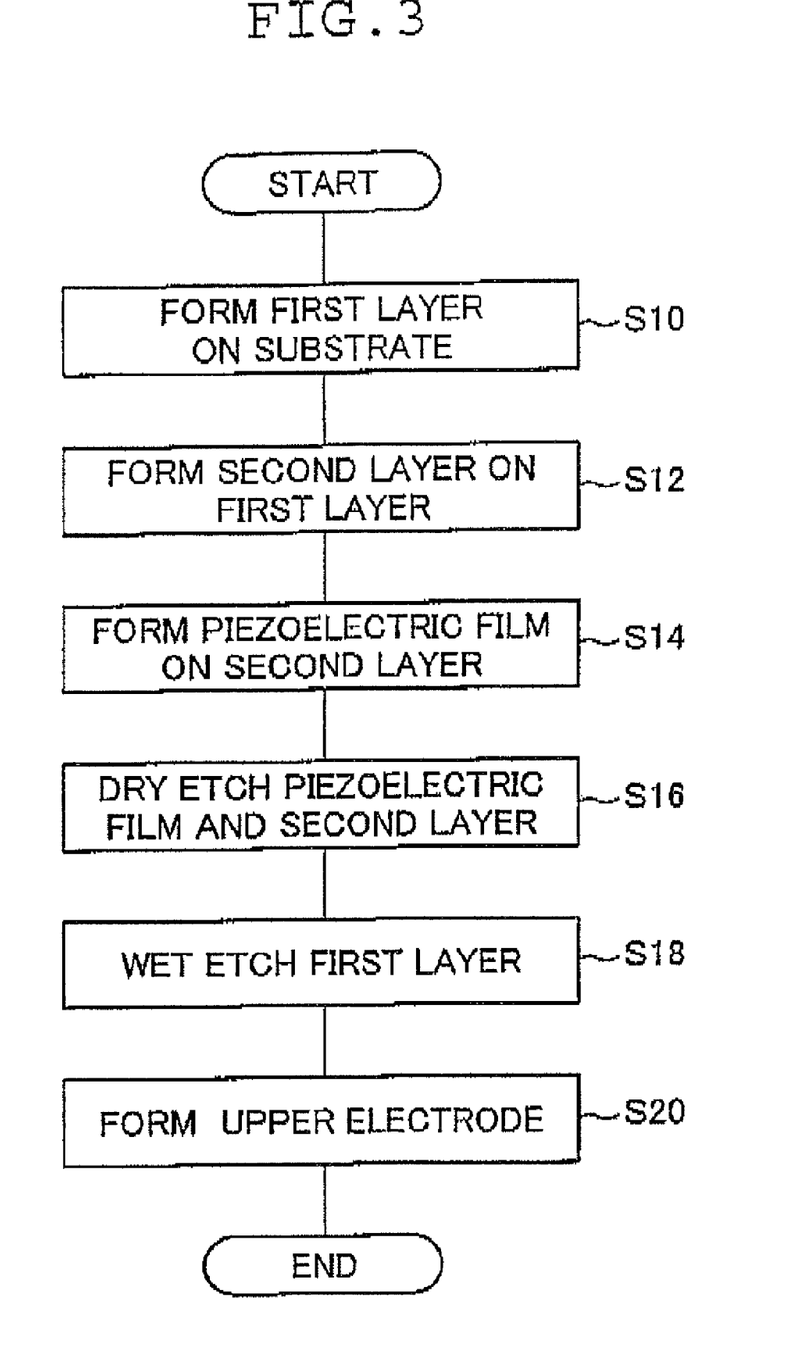
FIG. 3 is a flowchart depicting the steps in an embodiment of the process of the present invention for producing a piezoelectric device.

On the following pages, the process of the present invention for producing a piezoelectric device is described in greater detail with reference to FIG. 3.

As a start, the first layer of the lower electrode 20 is formed on the substrate (S10). The first layer of the lower electrode 20 may be fabricated by various methods including sputtering, evaporation, and mechanical attachment.

Then, the second layer of the lower electrode 20, is formed on top of the first layer on the substrate (S12). The second layer of the lower electrode 20 can also be fabricated by various methods including sputtering, evaporation, and mechanical attachment.

In the next step, a piezoelectric film is formed on top of the second layer of the lower electrode 20 (S14).

Specifically, the sputtering apparatus 50 is used again and the substrate 22 having the lower electrode 20 formed on it is set up as the deposition base B whereas a sinter of a material for the piezoelectric film such as PZT is set up as the target. Then, as mentioned above, the vacuum vessel 52 is filled with a predetermined gas and a plasma discharge is produced to form the piezoelectric film on top of the lower electrode 20 in the deposition base B.

In the next step, the piezoelectric film and the second layer of the lower electrode 20 are dry etched (S16). Specifically, a resist layer or the like is applied to form a mask pattern over the piezoelectric film and this piezoelectric film together with the second layer of the lower electrode 20 is dry etched.

Dry etching can be performed by a variety of reactive or ion etching methods such as one that uses a halogen gas and argon (Ar).

Dry etching performed in that way allows the piezoelectric film and the second layer of the lower electrode 20 to be formed in a predetermined pattern. Note here that dry etching should be performed to such a depth that the second layer of the lower electrode 20 is completely etched but the substrate is not. In other words, the first layer of the lower electrode 20 may be partially etched.

In the next step, the first layer of the lower electrode 20 is wet etched (S18). Specifically, the first layer of the lower electrode 20 is etched with a solution that etches it but which does not etch the substrate. If necessary, a mask may be formed over the piezoelectric film.

As a result of this wet etching, the first layer of the lower electrode 20 is etched in the same pattern as the second layer to form the lower electrode 20.

Then, the piezoelectric film is stripped of the overlying mask and the upper electrode 16 is formed on top of the piezoelectric film (S20). Note here that the method of fabricating the upper electrode 16 is not limited in any particular way and various methods may be employed, including sputtering or evaporation that use a mask or the like, and mechanical attachment.

This is how the piezoelectric device is produced.

As described above, the lower electrode is made to have a two-layer structure and the layer closer to the substrate is fabricated from a material that can be wet etched whereas the layer closer to the piezoelectric film is fabricated from a material that adheres well to the piezoelectric film, that has low sheet resistance and which can be deposited as a film when the piezoelectric film is being formed by a vapor phase deposition; as a result, a piezoelectric device can be fabricated easily in high precision without damaging the substrate.

Provision of the second layer offers another advantage: even if the second layer is overetched in dry etching, this only results in etching the first layer which is to be removed in the subsequent wet etching step, so the substrate can be prevented from being etched. In addition, as already mentioned, the first layer is fabricated from a material that will be wet etched at a different rate than the substrate and this allows the first layer to be etched without etching the substrate.

Also note here that if a PZT film is to be deposited by a plasma-assisted vapor phase deposition, the film deposition temperature Ts [° C.] and the plasma potential Vs [V] in the plasma during film deposition preferably satisfy both of the following relations (1) and (2):

$$400 \leq Ts \leq 475 \tag{1}$$

$$20 \leq Vs \leq 50 \tag{2}$$

Alternatively, both of the following relations (3) and (4) are preferably satisfied:

$$475 \leq Ts \leq 600 \tag{3}$$

$$Vs \leq 40 \tag{4}$$

By performing film deposition under such conditions that the above relations (1) and (2) are satisfied or, alternatively, both of relations (3) and (4) are satisfied, stable growth of perovskite crystals with a small content of the pyrochlore phase is realized to form a piezoelectric film having high piezoelectric characteristics.

The foregoing embodiment relates to the case of fabricating a piezoelectric film by a plasma-assisted vapor phase deposition but this is not the sole case of the present invention and light-, heat- or otherwise assisted vapor phase deposition can also be employed and piezoelectric films may be fabricated by using various vapor phase deposition including sputtering, ion-beam sputtering, ion plating, and CVD.

The present invention is by no means limited to the vapor phase deposition and the piezoelectric film may be bonded onto the second layer of the lower electrode 20 by means of an adhesive or the like.

The foregoing embodiment assumes the case where a piezoelectric film is formed of PZT having Zr and Ti as elements at site B since it has high piezoelectric characteristics, is comparatively inexpensive and can be fabricated with ease; however, this is not the sole case of the present invention and it may be equally applied to the case of fabricating a piezoelectric film based on the aforementioned $Pb_xB_yO_z$, as well as to the case of fabricating a lead-free piezoelectric film.

In the foregoing embodiment, the upper electrode is formed after etching the piezoelectric film and the lower electrode but this is not the sole case of the present invention and the upper electrode may be fabricated before etching the piezoelectric film. Stated specifically, the upper electrode may be fabricated after S14 in FIG. 3 but before S16.

While the piezoelectric device according to the first aspect of the present invention, the ink-jet head according to its second aspect which uses this piezoelectric device, and the process for producing the piezoelectric device according to the third aspect of the present invention have been described above in detail, it should be noted that the present invention is by no means limited to the embodiments described above and that various improvements and modifications are possible without departing from the scope and spirit of the present invention.

For example, the foregoing embodiments relate to the case of using the piezoelectric device according to the first aspect of the present invention in the ink-jet head according to the second aspect of the present invention; however, this is not the sole case of the present invention and it may be applicable as a piezoelectric device for use in various applications including memories and pressure sensors.

EXAMPLES

On the following pages, the piezoelectric device of the present invention is described in greater detail with reference to specific examples.

Example 1

The piezoelectric device of Example 1 was fabricated by the following procedure. FIGS. 4A to 4I show schematically the steps in the process for producing the piezoelectric device.

Figure 4A:
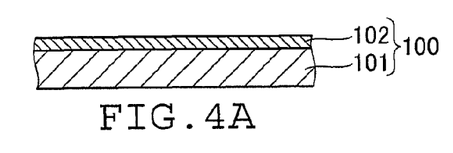

First, as shown in FIG. 4A, the substrate used in Example 1 was an SOI substrate 100 which was a Si substrate 101 having a $SiO_2$ film 102 formed on it.

Figure 4B:
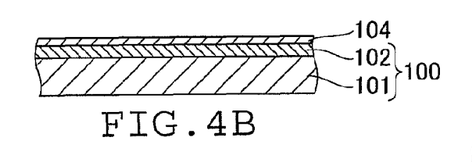

In the next step, a TiW film 104 was deposited to a thickness of 1600 nm on top of the $SiO_2$ film 102 of the SOI substrate 100 by sputtering (see FIG. 4B). The film deposition temperature in this step was 350° C.

Figure 4C:
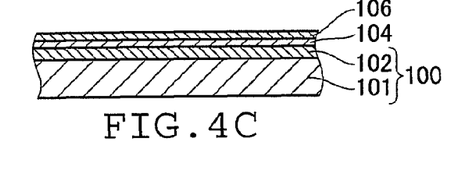

In a further step, an Ir film 106 was deposited to a thickness of 150 nm on the TiW film 104 by sputtering (see FIG. 4C). The film deposition temperature in this step was 305° C.

Thus deposited were the TiW film 104 and the Ir film 106 on the SOI substrate that would serve as the first and second layers, respectively, of the lower electrode.

Figure 4D:
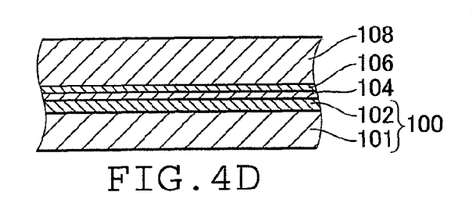

In the next step, a PZT film 108 was deposited on the Ir film 106 by sputtering (see FIG. 4D). Specifically, within the sputtering apparatus 50 already described above, the substrate having the TiW film 104 and the Ir film 106 deposited on the SOI substrate 100 was set up as a deposition base B and a PZT sinter was set up as a target T. The film deposition temperature in this step was 475° C.

Under the conditions mentioned above, the PZT film 108 that would serve as the piezoelectric film was deposited on the Ir film 106.

Figure 4E:
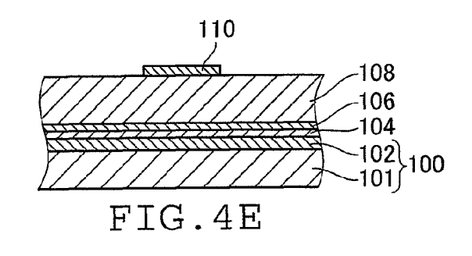

In the next step, patterning was effected by the lift-off method and with Ti forming an adhering layer, an Ir film was deposited on top of the PZT film 108 to thereby form an upper electrode 110 on the PZT film 108 (see FIG. 4E).

Figure 4F:
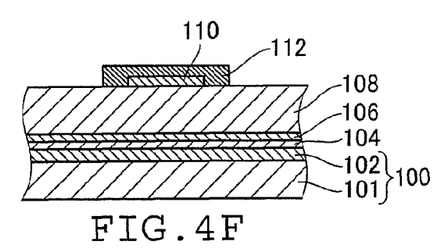

Subsequently, a resist layer 112 was formed in a predetermined region of the PZT film 108 that covered the upper electrode 110 (see FIG. 4F).

Then, with this resist layer 112 used as a mask, the PZT film 108 and the Ir film 106 were dry etched using a halogen gas and Ar. The dry etching was performed until the TiW film 104 was exposed. The TiW film 104 was partly etched but the SOI substrate 100 was not exposed. In other words, the SOI substrate 100 was not etched.

Thus, the PZT film 108 and the Ir film 106 were dry etched, with the resist layer 112 used as the mask, to fabricate a predetermined pattern of the piezoelectric film 108' and the second layer 106' (see FIG. 4G).

Thereafter, with the resist layer 112 further used as a mask, the TiW film 104 was wet etched using hydrogen peroxide ($H_2O_2$). Thus, the TiW film 104 was wet etched, with the resist layer 112 used as the mask, to fabricate a predetermined pattern of the first layer 104' (see FIG. 4H).

Figure 4H:
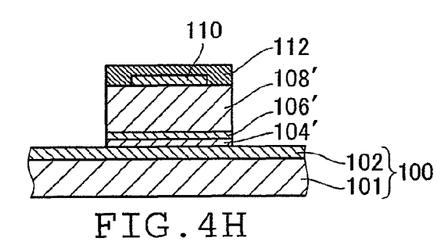

Since hydrogen peroxide was hardly effective as an etchant for $SiO_2$, the $SiO_2$ film 102 on the SCI substrate 100 was not etched.

Thereafter, the resist layer 112 was removed to fabricate a piezoelectric device having the lower electrode, the piezoelectric film, and the upper electrode formed in superposition on the substrate (see FIG. 4I).

The lower electrode in the thus fabricated piezoelectric device was measured for its sheet resistance, which was found to be 0.2 Ω/sq.

What is more, the lower electrode had good adhesion to the piezoelectric film and the substrate.

As a further advantage, etching of the lower electrode by the combination of dry and wet etching processes ensured that the lower electrode could positively be formed in a predetermined pattern without damaging the substrate. In addition, the use of the noble metal Ir in the lower electrode could be reduced to as small as 150 nm.

The orientation of the PZT film formed on the Ir film was measured by XRD (X-ray diffractometry); as a result, the PZT film was found to have a (100) orientation. The PZT film was found to have comparable hysteresis characteristics to the PZT film formed on the conventional lower electrode which was solely composed of Ir. In other words, the piezoelectric film fabricated using the two-layered lower electrode had the same performance as the conventional version.

Example 2

The procedure illustrated in FIG. 4 was repeated to fabricate a piezoelectric film having the two-layered lower electrode in which the first layer was an 820 nm-thick TiW film and the second layer was a 150 nm-thick Ir film.

The lower electrode in the piezoelectric device of Example 2 was measured for its sheet resistance, which was found to be 0.35 Ω/sq.

In addition, the piezoelectric device of Example 2 was also such that the piezoelectric film and the lower electrode could be fabricated without etching (i.e., damaging) the substrate.

Example 3

The procedure illustrated in FIG. 4 was repeated to fabricate a piezoelectric film having the two-layered lower electrode in which the first layer was a 1000 nm-thick TiW film and the second layer was a 1200 nm-thick Ir film.

The lower electrode in the piezoelectric device of Example 2 was measured for its sheet resistance, which was found to be 0.08 Ω/sq.

In addition, the piezoelectric device of Example 3 was also such that the piezoelectric film and the lower electrode could be fabricated without etching the substrate.

Comparative Example 1

In Comparative Example 1, a piezoelectric device having a mono-layered lower electrode was fabricated and evaluated for its quality and sheet resistance.

The piezoelectric device of Comparative Example 1 was fabricated by the following procedure, which was the same as in Examples 1-3 except that no TiW film was formed and hence no wet etching was performed to pattern a TiW film; because of this similarity, the individual steps in that procedure are not described in detail.

First, a 150 nm-thick Ir film was deposited on an SIO substrate by sputtering. Thereafter, a PZT film was formed on top of the Ir film on the SIO substrate by sputtering. Thereafter, an upper electrode was formed on top of the PZT film and a resist layer was formed in a region of the PZT film that covered the upper electrode. Subsequently, with the resist layer used as a mask, the PZT film and the Ir film were dry etched. The resist layer was then removed.

Figure 5A:
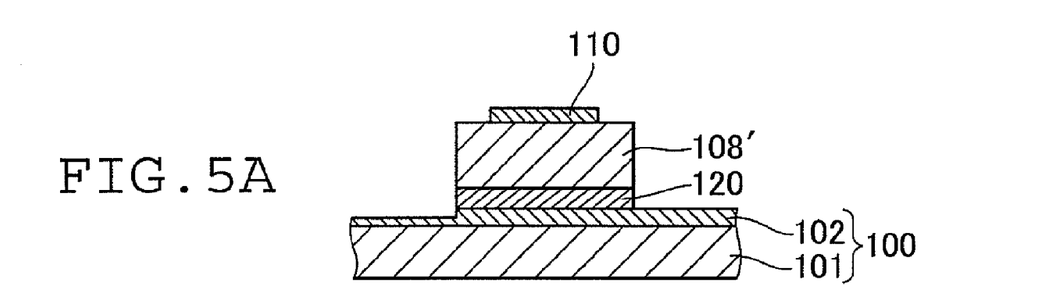
FIGS. 5A and 5B are sectional views showing the general layout of a piezoelectric device fabricated as a comparative example.
Figure 5B:
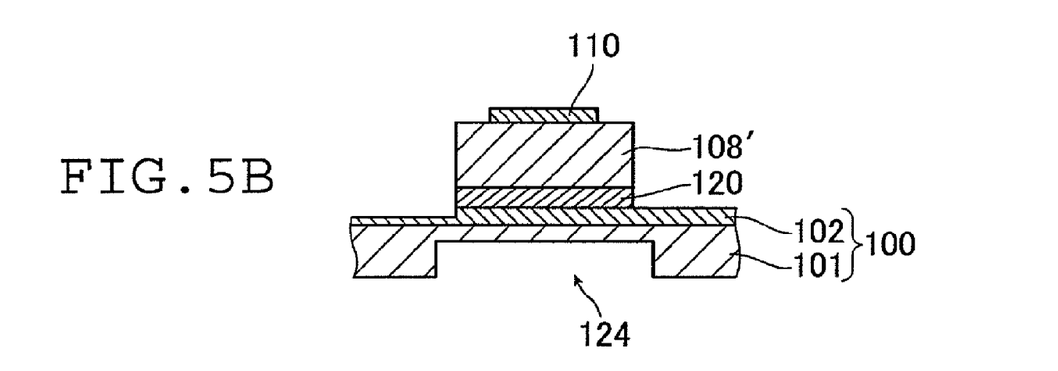

The thus fabricated comparative sample of piezoelectric device is shown in FIGS. 5A and 5B which are sectional views of the general layout of the device.

The lower electrode in the thus fabricated piezoelectric device was measured for its sheet resistance, which was found to be 1.1 Ω/sq. Since the Ir film 120 directly formed on the SOI substrate 100 was removed by dry etching, part of the SOI substrate 100 (to be specific, part of the $SiO_2$ layer 102) was etched away as shown in FIG. 5A.

With part of the SOI substrate 100 being thusly etched away, the thickness of the Si substrate 101 in an area around an ink compartment 124 formed became nonuniform, as shown in FIG. 5B, to lower the precision of vibrations that would be transmitted from the piezoelectric unit to the ink compartment and to the diaphragm. In Comparative Example 1, the ink compartment was formed in the SOI substrate 100; if the diaphragm and the liquid droplet storing/ejecting member were formed in the SOI substrate, the same result would occur because of variations in the thickness of the SOI substrate.

Comparative Example 2

In Comparative Example 2, a piezoelectric device was fabricated by the same procedure as in Comparative Example 1, except that the thickness of the Ir film was changed to 1500 nm.

The lower electrode in the thus fabricated piezoelectric device was measured for its sheet resistance, which was found to be 0.11 Ω/sq. Since the Ir film directly formed on the SOI substrate was removed by dry etching, part of the SOI substrate was etched away.

The results of measurements conducted in the foregoing Examples and Comparative Examples are summarized in Table 1 below.

TABLE 1

| | TiW film [nm] | Ir film [nm] | Sheet resistance [Ω/sq] | Sheet resistance Rating | Precision in etching Rating |
|---|---|---|---|---|---|
| Example 1 | 1600 | 150 | 0.2 | Good | Good |
| Example 2 | 820 | 150 | 0.35 | Good | Good |
| Example 3 | 1000 | 1200 | 0.08 | Good | Good |
| Comparative Example 1 | Absent | 150 | 1.1 | Poor | Poor |
| Comparative Example 2 | Absent | 1500 | 0.11 | Good | Poor |

As can be seen from Table 1, forming the lower electrode in two layers and making the layer in contact with the substrate of a material that can be wet etched contributes to forming the lower electrode without overetching the substrate.

Adopting the two-layer structure has the additional advantage of reducing the use of the precious Ir and the sheet resistance of the lower electrode to thereby enable the production of piezoelectric devices that have lower enough electric resistance to generate less heat and which are yet inexpensive.

The foregoing clearly shows the benefits of the present invention.

The foregoing embodiment relates to the case of forming the substrate and the first layer of the lower electrode from $SiO_2$ and TiW, respectively, and using aqueous hydrogen peroxide as a liquid etchant; however, this is not the sole case of the present invention and various other combinations may be adopted to realize different etching rates; for example, the substrate consisting of Si with a surface oxide film may be combined with the first layer formed of Au and with a liquid etchant comprising a mixture of $I_2$ and KI, and this combination offers the same advantages as described above.

What is claimed is:

1. A process for producing a piezoelectric device having a first electrode, a piezoelectric film and a second electrode formed in superposition on a substrate, comprising the steps of:
    forming on said substrate a first metal film that is composed of a material that is wet etched at a different rate than said substrate;
    forming a second metal film on said first metal film;
    forming a piezoelectric film layer over said second metal film;
    patterning said piezoelectric film layer by etching to form the piezoelectric film;
    patterning said second metal film by dry etching; and
    patterning said first metal film by wet etching after patterning said second metal film to form said first electrode.

2. The process for producing a piezoelectric device according to claim 1, wherein said first metal film is formed of at least one material selected from the group consisting of W, TiW, Au, Cu, Al, Ni, and Cr.

3. The process for producing a piezoelectric device according to claim 1, wherein said second metal film is formed of at least one material selected from the group consisting of Pt, Ir, Ru, Rh, and Pd.

4. The process for producing a piezoelectric device according to claim 1, wherein said first electrode has a sheet resistance of no greater than 0.5 Ω/sq.

5. The process for producing a piezoelectric device according to claim 1, wherein said substrate is formed of Si or $SiO_2$.

6. The process for producing a piezoelectric device according to claim 1, wherein said piezoelectric film expands or contracts according to voltage applied by said first electrode and said second electrode.

7. The process for producing a piezoelectric device according to claim 1,
wherein the dry etching of said second metal film is performed to such a depth that said second metal film is completely etched but said substrate is not.

8. The process for producing a piezoelectric device according to claim 1,
wherein said piezoelectric film layer and said second metal film are dry etched so that said second metal film is formed in a same pattern as that of said piezoelectric film.

9. The process for producing a piezoelectric device according to claim 1,
wherein said first metal film and said second metal film are formed in a same pattern as that of said piezoelectric film.

10. The process for producing a piezoelectric device according to claim 1,
wherein said first metal film comprises a material that is wet etched with a solution that has a small etching effect on said substrate.

11. The process for producing a piezoelectric device according to claim 1,
wherein said first metal film comprises a material that is wet etched at a rate at least 10 times as fast as said substrate.

12. The process for producing a piezoelectric device according to claim 1,
wherein said first metal film comprises a material that is wet etched with a solution that has no etching effect on said substrate.

* * * * *